United States Patent [19]
de Cremoux et al.

[11] Patent Number: 5,232,867
[45] Date of Patent: Aug. 3, 1993

[54] METHOD FOR THE MAKING OF OPTOELECTRONIC SEMICONDUCTOR DEVICES

[75] Inventors: Baudouin de Cremoux, Orsay; Manijeh Razeghi, Yvette, both of France

[73] Assignee: Thomson-CSF, Puteaux, France

[21] Appl. No.: 866,354

[22] Filed: Apr. 10, 1992

[30] Foreign Application Priority Data

Apr. 12, 1991 [FR] France ............................... 91 04513

[51] Int. Cl.⁵ ......................................... H01L 21/203
[52] U.S. Cl. ................................... 437/129; 437/167; 437/936; 148/DIG. 160
[58] Field of Search ............... 437/106, 107, 110, 129, 437/167, 936, 969; 148/DIG. 63, DIG. 64, DIG. 65, DIG. 95, DIG. 160

[56] References Cited

U.S. PATENT DOCUMENTS

| | | | |
|---|---|---|---|
| 4,771,010 | 9/1988 | Epler et al. | 437/936 |
| 4,971,928 | 11/1990 | Fuller | 437/129 |
| 5,045,499 | 9/1991 | Nishizawa et al. | 437/129 |
| 5,124,279 | 6/1992 | Goto | 437/129 |

OTHER PUBLICATIONS

Applied Physics Letters, vol. 52, No. 17, Apr. 25, 1988, New York, USA, pp. 1413-1415, D. G. Deppe et al., "Impurity-Induced Layer Disordering of High Gap $IN_Y(Al_XGa_{1-x})_{1-y}P$ Heterostructures".
Journal of Applied Physics, vol. 64, No. 12, Dec. 15, 1988, New York, USA, pp. R93-R113, D. G. Deppe, et al., "Atom Diffusion and Impurity-Induced Layer Disordering in Quantum Well III-V Semiconductor ...".
Journal of Applied Physics, vol. 66, No. 2, Jul. 15, 1989, New York, USA, pp. 482-487, J. M. Dallesasse, et al., "Impurity-Induced Layer Disordering in $Ln_{0.5}(Al_X Ga_{1-x})_{0.5}P$-LnGaP Quantum-Well Heterostructures: ...".
IEEE Photonics Technology Letters, vol. 2, No. 1, Jan. 1990, New York, USA, pp. 1-2, Y. Kawamura, et al., "InGaAs/InAlAs SCH-MQW Lasers with Superlattice Optical Confinement Layers Grown by MBE".
Electronics Letters, vol. 24, No. 3, Feb. 4, 1988, Enage, GB, pp. 181-182, B. C. Johnson, et al., "Two-Wavelength Disordered Quantum-Well Photodetector".
Applied Physics Letters, vol. 51, No. 24, Dec. 14, 1987, New York, USA, pp. 1982-1985, R. L. Thornton, et al., "Monolithic Integration of a Transparent Dielectric Waveguide into an Active Laser ...".
Applied Physics Letters, vol. 50, No. 14, Apr. 6, 1987, New York, USA, pp. 866-868, F. Julien, et al., "Impurity-Induced Disorder-Delineated Optical Waveguides in GaAs-AlGaAs Superlattices".
IEEE Lasers and Electo-Optics Society Annual Meeting, Santa Clara, Calif., USA, Nov. 2, 1988, IEEE, New York, USA, pp. 87-89, J. Werner et al., "Waveguide Losses of a Partially Disordered Quantum Well ...".
Proc. 15th Int. Symp. on Gallium Arsenide and Relat. Comp., Atlanta, Ga., USA, Sep. 11, 1988, Institute of Physics, Bristol, UK, pp. 83-88, M. Ikeda, et al., "MOCVD Growth of AlGaInP On a (111)B GaAs ...".
IEE, Lasers and Electro-Optics Society Annual Meeting, Santa Clara, Calif.<USA, Nov. 2, 1988, IEEE, New York, USA, pp. 29-30, R. L. Thornton, et al., "Unified Planar Process for Fabricating Heterojunction ...".

Primary Examiner—Brian E. Hearn
Assistant Examiner—C. Chaudhari
Attorney, Agent, or Firm—Oblon, Spivak, McClelland, Maier & Neustadt

[57] ABSTRACT

A method for the making of an optoelectronic device comprising at least one quantum well, the barriers of which are made of GaInP and the well of which is made of GaAs, is carried out by the interdiffusion of elements between barriers and quantum wells in such a way that there is a migration of at least indium elements from a barrier to the quantum well. The method can be applied to the making of quantum well lasers, photodetectors and optical guides.

12 Claims, 10 Drawing Sheets

METHOD FOR THE MAKING OF OPTOELECTRONIC SEMICONDUCTOR DEVICES

BACKGROUND OF THE INVENTION

1. Field of the Invention

The invention relates to a method for the making of optoelectronic semiconductor devices and notably of quantum well lasers.

The invention can be applied more particularly to the making of GaAs/GaInP-based lasers with vertical or horizontal cavities, namely with emissions by the surface or emission by the edge.

A preferred application of the invention is the making of optoelectronic devices such as lasers integrated with optical guides. In such an application, the interconnection of the optoelectronic devices is made easier.

2. Description of the Prior Art

The association of several optoelectronic laser devices calls for the association of devices constituted by materials having different gap energy levels. For a determined emission wavelength, the material of the active layer of a laser should have a determined gap energy level Eg. For this same wavelength, a guiding element should have a gap energy level greater than the gap energy level Eg of the laser material in order to be transparent to this wavelength. Conversely, to be absorbent at this same wavelength, a detector should have a gap energy level at most equal to the gap energy level Eg of the laser material. This can be illustrated by the relationship:

$$Eg_{detector} < Eg_{laser} < Eg_{guide}$$

SUMMARY OF THE INVENTION

The invention relates to the association of several optoelectronic devices and has the advantage of reducing the steps of manufacture (epitaxy steps) of this type of device.

The invention therefore relates to a method for the making of optoelectronic semiconductor devices, wherein said method comprises the making of at least one semiconductor quantum well followed by an interdiffusion of the barriers of the quantum well so that there is a migration of semiconductor elements from this barrier towards the quantum well.

BRIEF DESCRIPTION OF THE DRAWINGS

The different objects and features of the invention will appear more clearly from the following description and from the figures, of which.

MORE DETAILED DESCRIPTION

As has been seen here above, the optical behavior of an optoelectronic device is related to the gap energy level of the material or materials that constitute it.

The concept of the invention lies in the fact of making at least one active layer sandwiched between two confinement layers and of prompting the transfer of elements from a confinement layer towards the active layer or vice versa. The gap energy levels of these different layers and hence their optical behavior are thus modified.

This transfer or interdiffusion of elements among layers can be assisted by the diffusion of impurities or by ion implantation.

For example, by starting with a system of layers comprising at least one active layer of GaAs sandwiched between two confinement layers of GaInP, and by making a zinc diffusion, an interdiffusion of the indium of the confinement layers towards the active layer will be prompted.

The active layer of GaAs will take on a GaInAs composition. Its gap energy level will diminish and its wavelength corresponding to this gap energy level will increase.

The confinement layer subjected to the zinc diffusion will also change its composition. For example, it will change from a $Ga_{0.51}In_{0.49}P$ composition to a $Ga_{0.5-+d}In_{0.49-d}P$ composition. Its gap energy level will increase and the corresponding wavelength will decrease.

If the zinc diffusion is done in only one part of the device, a laser capable of emitting at a determined wavelength will be made in this zone. The active layer not subjected to this diffusion retains a gap energy level greater than that assumed by the active layer subjected to interdiffusion. The zone not subjected to diffusion may therefore serve to guide the wave emitted by the laser.

In the same way, it is possible to implant a photodetector in the same layers.

With respect to the transfer of elements by ion implantation it is possible, in the same example of a GaInP/GaAs/GaInP system as above, to prompt an interdiffusion of group III and V elements such as In and P. This interdiffusion could be done by the implantation of germanium or silicon ions.

The active layer changes from a GaAs composition to a $Ga_xIn_{1-x}As_yP_{1-y}$ composition. Its gap energy level increases and the corresponding wavelength decreases.

The confinement layer subjected to implantation goes from the GaInP composition to a $Ga_zIn_{1-z}As_tP_{1-t}$ composition. Its gap energy level decreases and the corresponding wavelength increases.

An ion implantation such as this in an active layer of a laser will therefore have the effect of making this layer transparent (for the making of a guide) to the laser wavelength.

Figure 1:
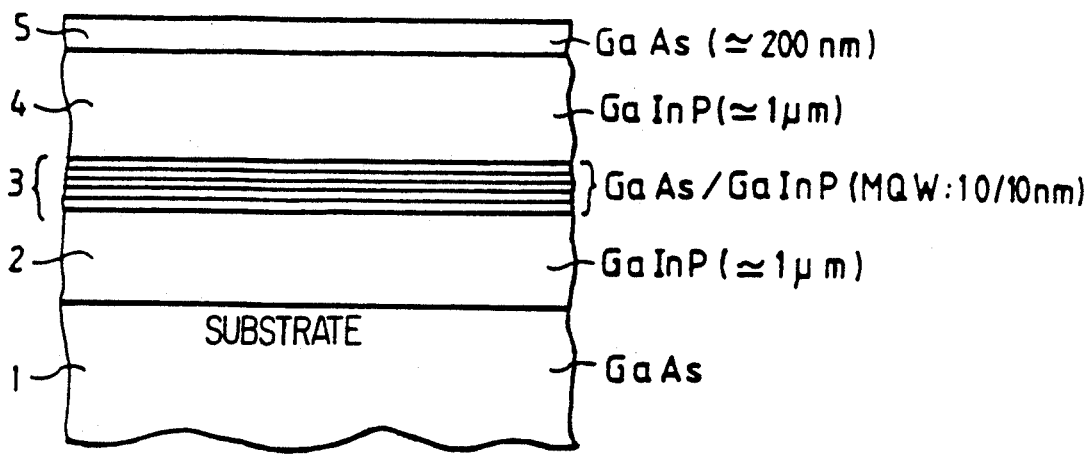
FIGS. 1 to 8 show an exemplary method of making the device according to the invention, by diffusion.

Referring to FIG. 1, we shall now describe an exemplary basic embodiment of the method of the invention.

There is a substrate 1 made of a semiconductor such as GaAs, InP, silicon etc. For example, this substrate 1 is made of n type GaAs and the following different layers are made on this substrate by epitaxy:

1) An n type layer 2 of GaInP with a thickness of 1 μm for example.

2) A series 3 of not intentionally doped GaAs/GaInP superlattices (thickness of the GaAs: about 10 nm; thickness of the GaInP: about 5 nm for example).

3) A layer 4 of not intentionally doped GaInP with a thickness of 1 μm for example.

4) A layer 5 of not intentionally doped GaAs (with thickness of 200 nm for example), acting as a contact layer.

These epitaxies may be done by MOCVD, MOMBE, VPE or LPE.

Figure 2:
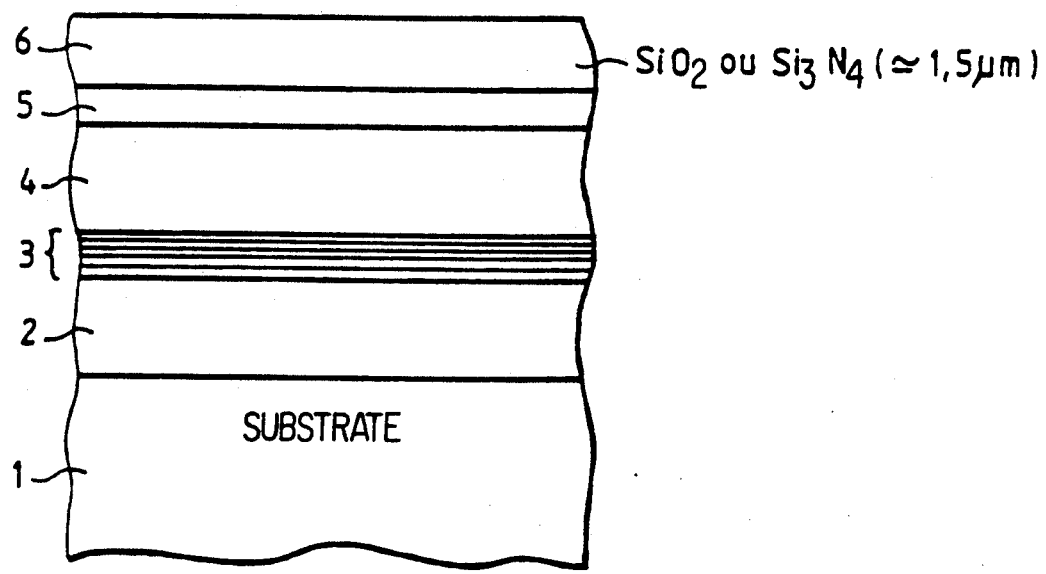
Figure 3:
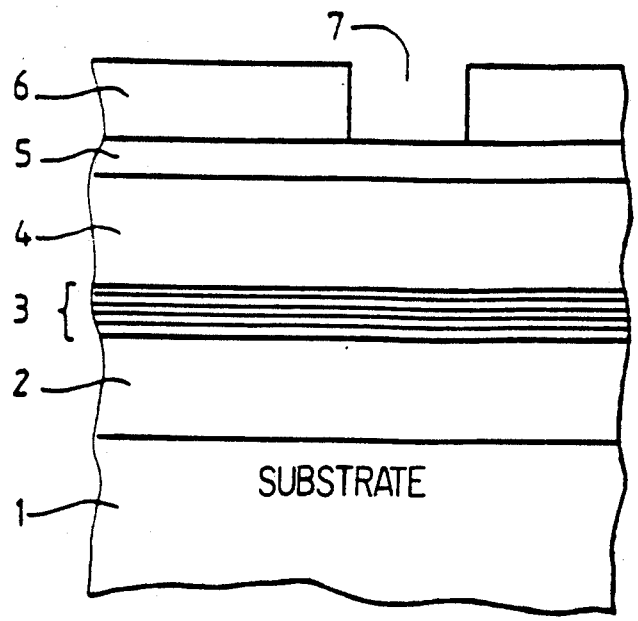
Figure 4:
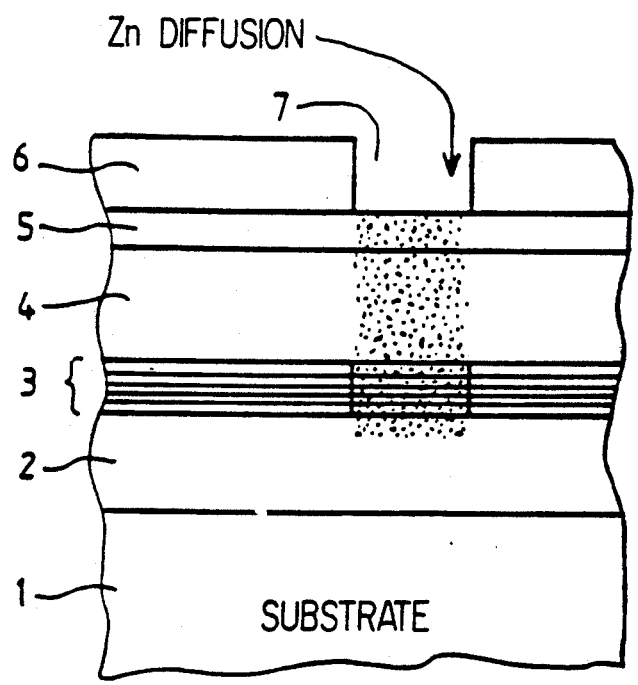

The epitaxially grown layers then undergo the following processing operations:

1) A deposition 6 of silica (2 $\mu$m thick for example) is made on the upper face (FIG. 2);
2) By optical or electronic masking, windows 7 (FIG. 3) are opened.
3) A diffusion of zinc is made through the silica mask by the windows 7, so as to define active zones of the components to be obtained (FIG. 4) The diffusion of the zinc will create an interdiffusion of the group III elements at the interfaces between the GaInP barriers and the GaAs quantum wells. Consequently, the GaAs quantum wells change their chemical nature and locally become GaInAs wells with a smaller gap energy level and hence a greater wavelength.

Figure 5:
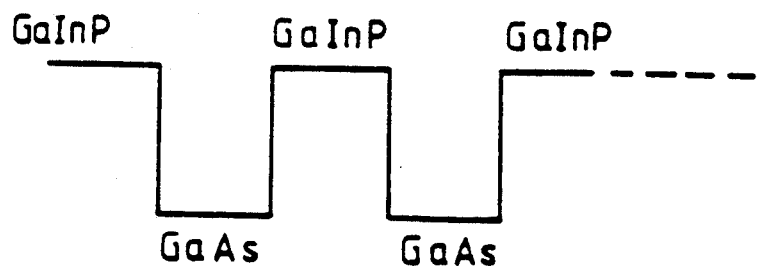

Before the diffusion of zinc, the conduction band profile of each well of the superlattice 3 is as shown in FIG. 5:

GaInP/GaAs/GaInP

Figure 6:
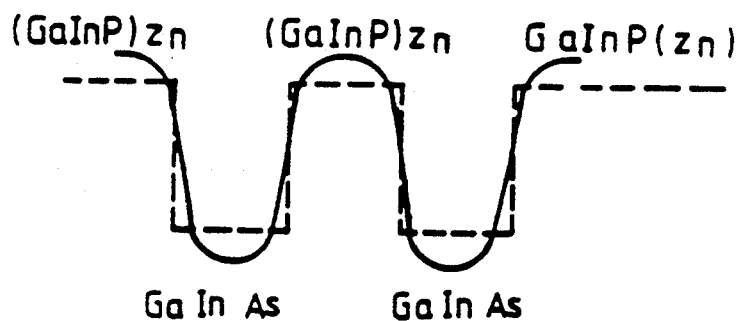

After the diffusion of zinc, the indium being diffused from the barrier layers towards the quantum well layer, the conduction band profile is as shown in FIG. 6:

GaInP,Zn/GaInAs/GaInP,Zn

Firstly, by controlling the time and temperature of diffusion of the zinc, it is possible to control the composition of the GaInAs and thus control the wavelength of emission of the quantum structure.

Secondly, the quantum well superlattice is surrounded by GaInP barriers 2 and 4 and GaAs barriers 1 and 5, of a p and n type, which act as p and n type confinement layers.

A p-n junction is thus created.

Figure 7:
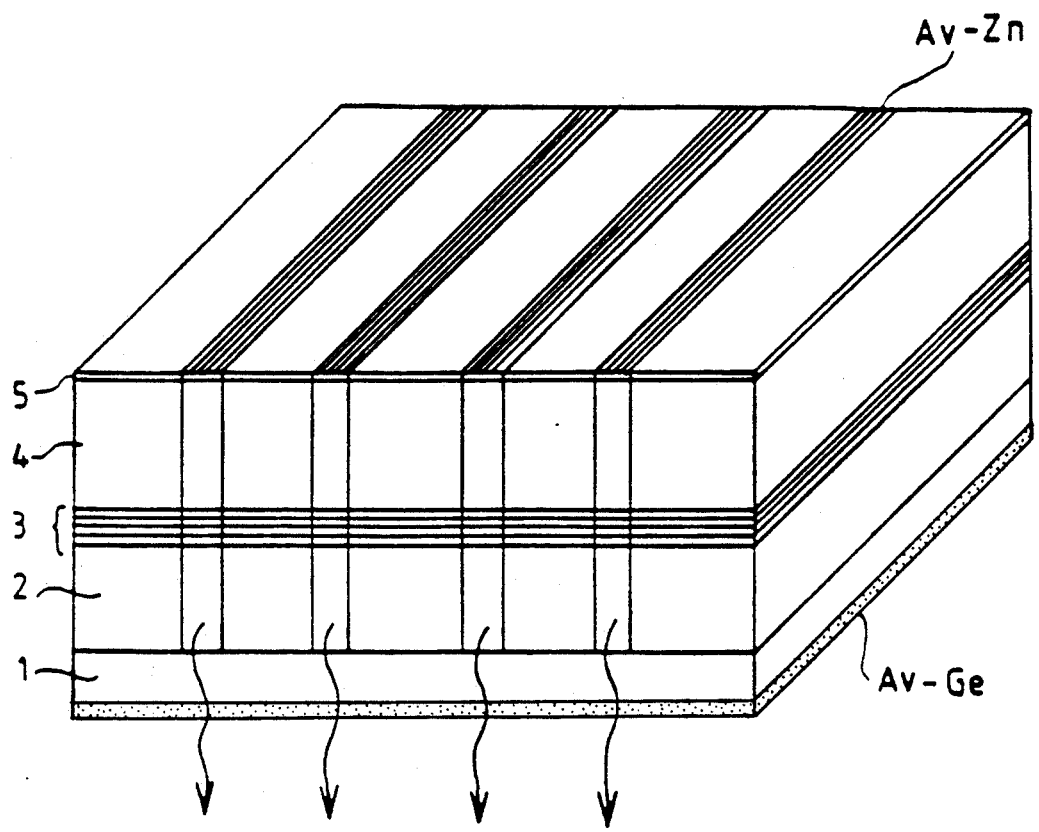
Figure 8:
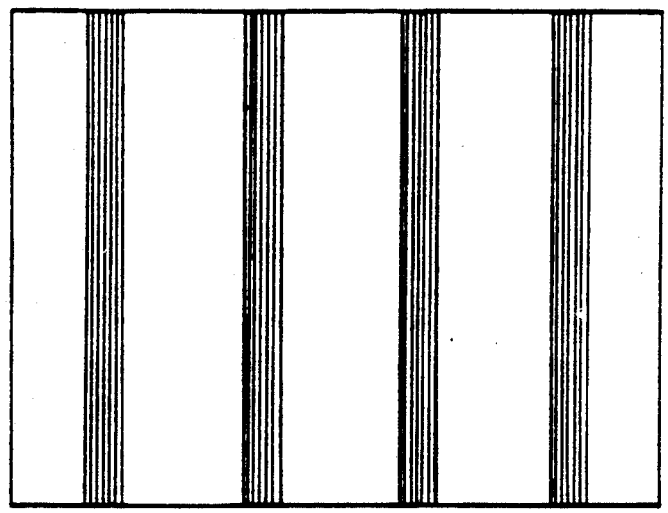

The following technology is used to manufacture lasers emitting by the surface:

1) The p type ohmic contacts are made by the deposition of AuZn, the n type ohmic contacts being made by the deposition of AuGe on the front and rear faces of the sample according to the pattern shown in FIGS. 7 and 8.
2) It is also possible to locally thin down the substrate at the doped zones of the active layer 3 so as to make the optical windows through which the laser emission takes place, but this is not necessarily indispensable if the substrate is transparent.

The above-described structure may be improved if Bragg reflectors are incorporated therein. These reflectors, based on GaAs-GaInP superlattices, can be used to make a cavity with high reflectivity for the laser effect. Profitable use is made, in this effect, of the great difference existing between the respective optical indices of GaAs and GaInP.

Figure 9:
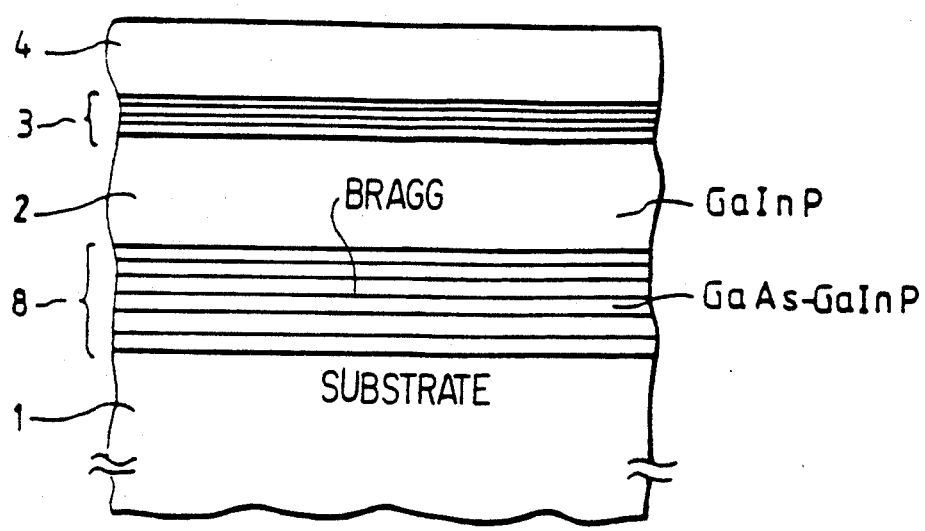
FIGS. 9 to 12 show an exemplary method according to the method of FIGS. 1 to 8 for the making of a device comprising Bragg mirrors.

The method of making this structure is as follows:

The following layers are first of all made by implementing the MOCVD, MOMBE, VPE or LPE techniques on a substrate 1 which may be GaAs, InP, Si etc. (FIG. 9):

1) A first n type superlattice 8 (GaAs-GaInP) designed to form a first Bragg reflector, the thickness of the GaAs and GaInP layers as well as the superlattice pitch being chosen as a function of the wavelength of emission of the laser; 10 to 20 GaAs-GaInP superlattice pitches are sufficient to manufacture the Bragg reflector.
2) A layer 2 of n type GaInP with a thickness of 1 $\mu$m;
3) A series 3 of GaAs/GaInP superlattices (thickness of the GaAs: about 10 nm; thickness of the GaInP: about 5 nm).
4) A layer 4 of not intentionally doped GaInP with a thickness of 1 $\mu$m for example.

Figure 10:
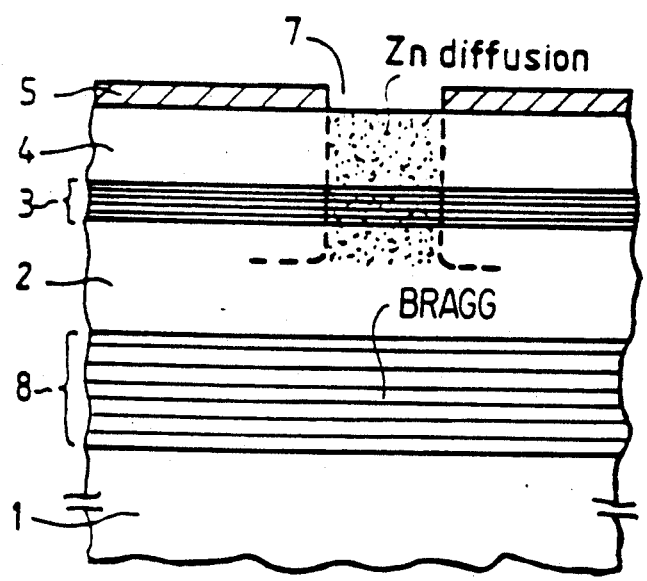

The epitaxially grown layers then undergo the following processing operations (FIG. 10):

1) A deposition 5 of silica, 2 $\mu$m thick, is made on the upper face;
2) By optical or electronic masking, windows 7 are opened.
3) A diffusion of zinc is made through the silica mask by the windows 7, so as to define active zones of the components to be obtained. The diffusion of the zinc will create an interdiffusion of the group III elements at the interfaces between the GaInP barriers and the GaAs quantum wells. Consequently, the GaAs quantum wells change their chemical nature, in locally becoming GaInAs wells with a smaller gap energy level and a greater wavelength.

As above, by controlling the time and temperature of diffusion of the zinc, it is possible to control the composition of the GaInAs and thus control the wavelength of emission of the quantum structure.

Similarly, the quantum well superlattice is surrounded by p and n type GaInP and GaAs barriers, which act as p and n type confinement layers.

A p-n junction is thus created.

After the removal of the silica mask 5, the MOCVD, MOMBE, VPE or LPE techniques are implemented to make a second p type GaAs-GaInP superlattice 9 designed to form the second Bragg reflector, the thickness of the GaAs and GaInP layers as well as the pitch being here again chosen as a function of the wavelength of emission of the laser; 10 to 20 GaAs-GaInP superlattices pitches are sufficient to manufacture the Bragg reflector.

Figure 11:
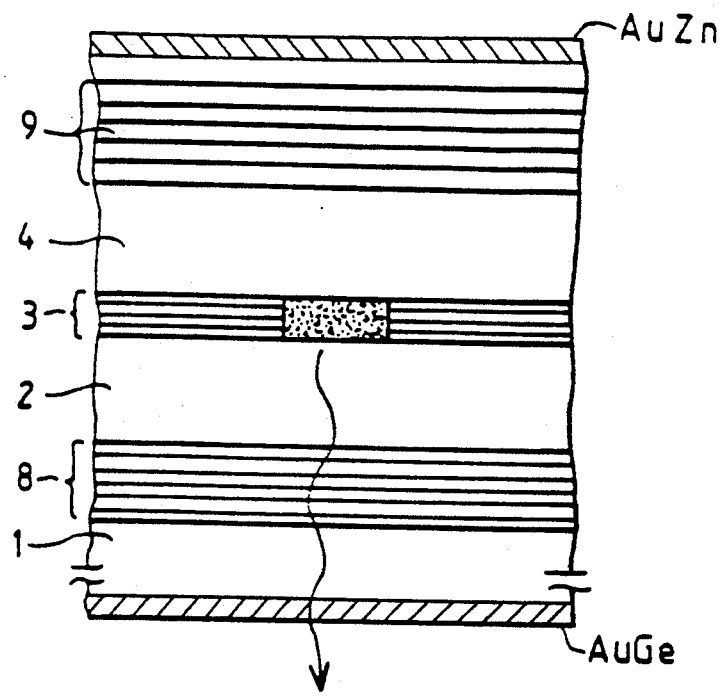

The manufacture of the lasers is ended as follows:

1) The p type ohmic contacts are made by the deposition of AuZn, the n type ohmic contacts being made by the deposition of AuGe on the lower face (FIG. 11).
2) It is also possible to locally thin down the substrate at the p type doped zones, so as to make the optical windows through which the laser emission takes place, but this is not obligatory if the substrate is transparent.

Figure 12:
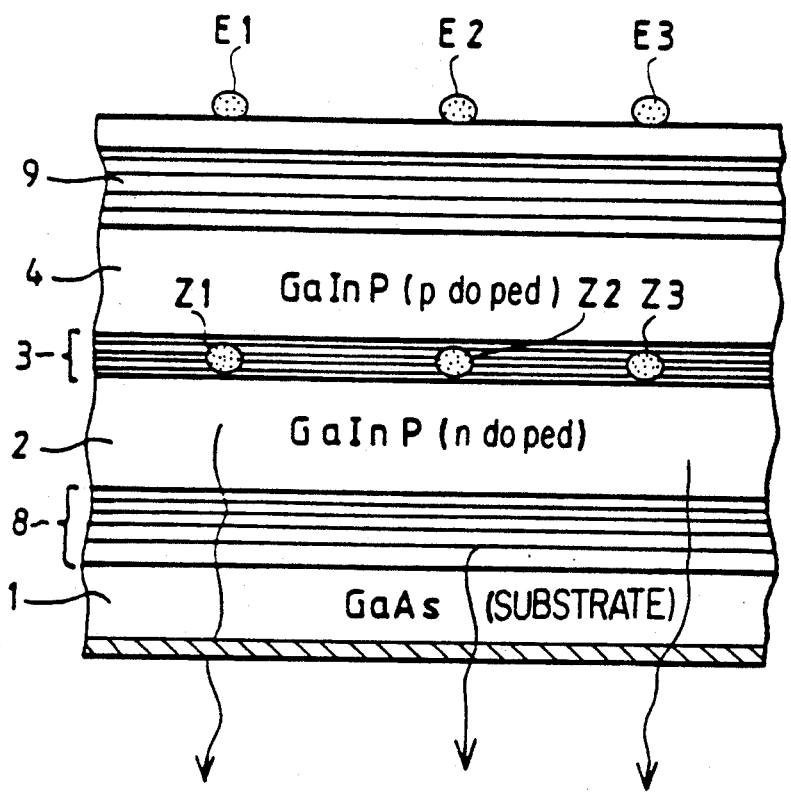

FIG. 12 shows a laser device wherein, with each active zone Z1, Z2, Z3 that has been subjected to an interdiffusion of elements, there is associated an individual control electrode E1, E2, E3.

It is necessary, however, to provide for an insulation of the electrodes E1, E2, E3. To this end, it is possible:
either to dope solely the zones Y1, Y2, Y3 of the superlattice 9 with p type doping;
or to etch the layers of the superlattice 9 between the zones Y1, Y2, Y3;
or to make a proton implantation between the zones Y1, Y2, Y3.

The above described methods enable the making of lasers emitting by the surface.

According to the invention, it is also possible to make lasers with emission by the edge and preferably to make a laser integrated with its output interconnection optical guide.

The making of a laser such as this shall now be described.

On a substrate 1, made of GaAs for example, the following layers (FIG. 13) are grown epitaxially:

A confinement layer 10 of n doped GaInP having a thickness of about 1 μm and a doping $N_D - N_A = 10^{18} \text{cm}^{-3}$.

Figure 13:
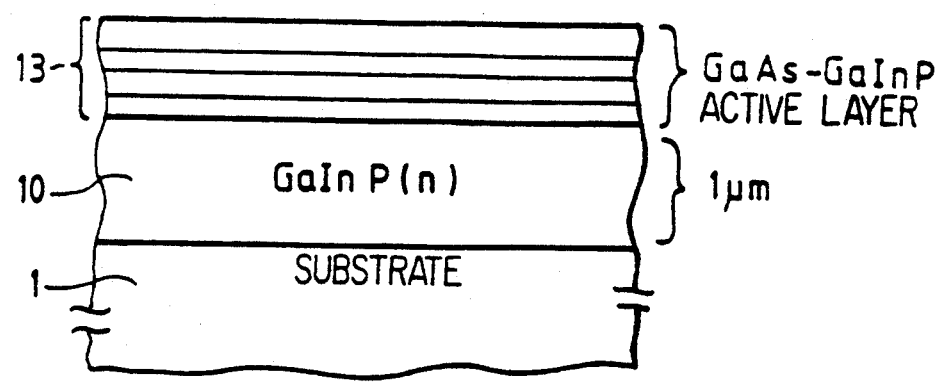
FIGS. 13 to 16 show another example of a method according to the invention, using diffusion.

A series 13 of GaAs-GaInP quantum wells for the making of the active layers of the laser, and of the guide (FIG. 13). The layers of the different quantum wells have the following thickness for example:

$$Lz = 10 \text{ nm}, L_N = 10 \text{ nm}$$

Figure 14:
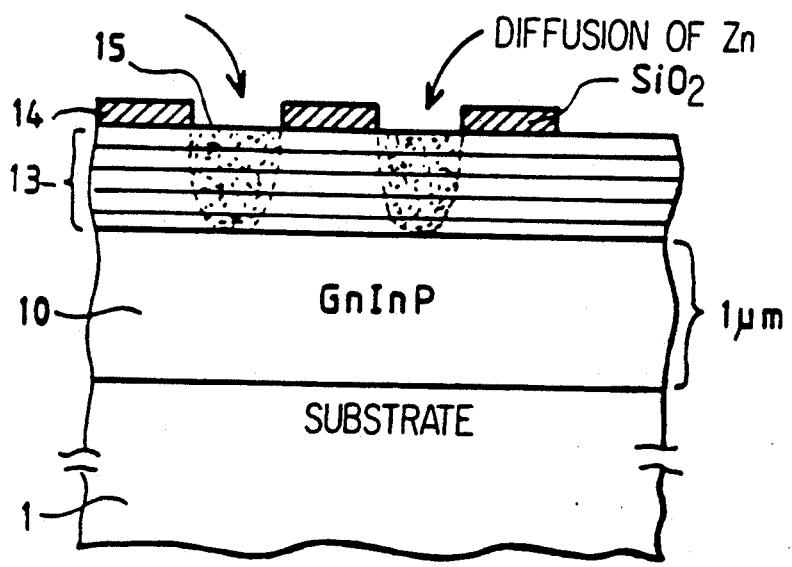

The number of quantum wells will be set at about ten for example. Then, according to FIG. 14, a masking 14 is done by silica ($SiO_2$). In this masking, at least one window 15 is made.

Then, as earlier, a zone diffusion is made at 150° C. for 30 minutes (the diffusion time depends on the thickness of the active layer).

The interdiffusion of the group III elements at the interface of the GaAs-GaInP quantum wells as above changes the gap energy level of the active layer 13 of the laser. Indeed, the diffusion of the zinc will create an interdiffusion of group III elements at the interfaces between the GaInP barriers and the GaAs quantum wells. Consequently, the GaAs quantum wells change their chemical nature in locally becoming GaInAs wells with a smaller gap width and a greater wavelength. As above, by controlling the time and the temperature of diffusion of the zinc, it is possible to control the GaInAs composition and thus control the wavelength of emission of the quantum structure. The quantum well thus obtained is surrounded by materials that have greater gap widths and can be used as guides for the light emitted by the laser.

The layer 14 of silica $SiO_2$ is then removed.

Figure 15:
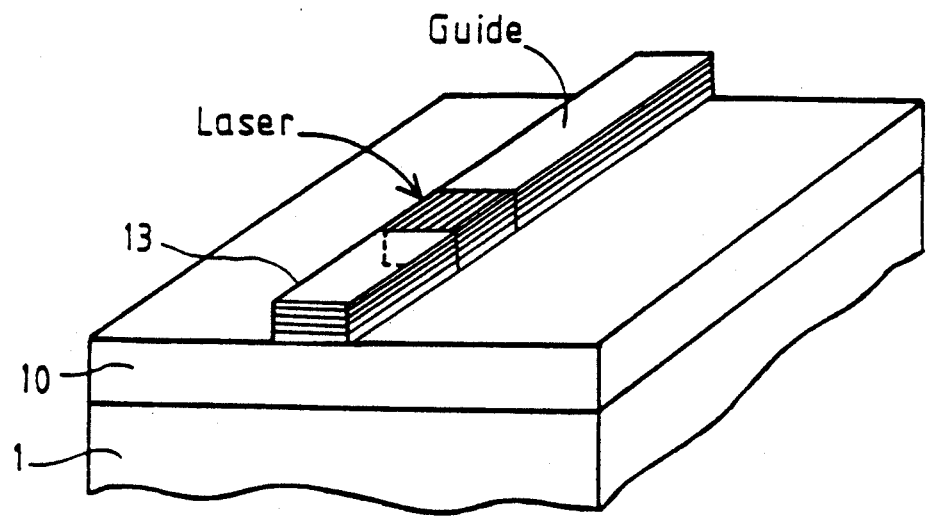

To determine the guides laterally, an etching of the active layer (superlattice 3) is carried out as shown in FIG. 15.

Figure 16:
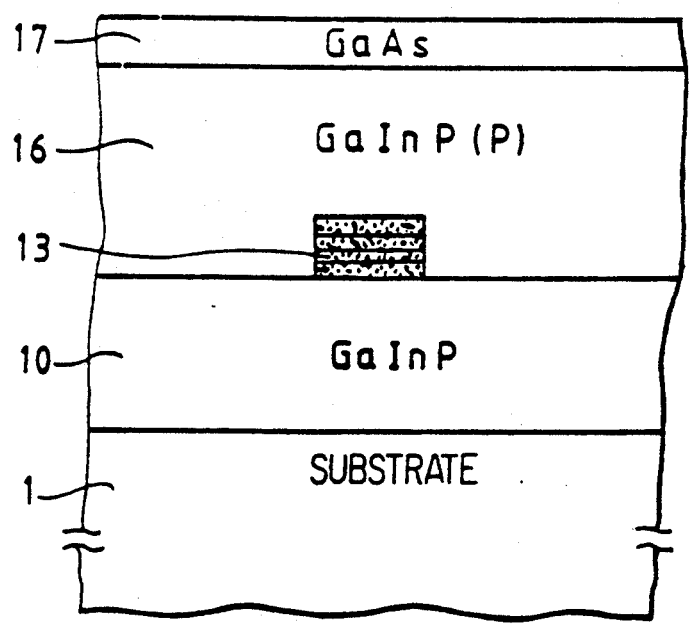

Then, a layer 16 of GaInP is made, with a thickness of about 1 μm and with p type doping, at $5 \times 17^{17} \text{cm}^{-3}$, for the confinement of the laser layers and the guiding layers. Another layer 17 of GaAs is deposited. It has, for example, a thickness of 0.5 μm and has Zn doping with $N_A - N_D \approx 10^{19} \text{cm}^{-3}$ to make the ohmic contact layer. Thus, the structure of FIG. 16 is obtained.

In the foregoing, a method has been described wherein it is possible, by the diffusion of a material (zinc in the example described) to prompt an interdiffusion of a constituent element from a barrier layer of a quantum well towards the quantum well layer. However, any other method enabling the making of an interdiffusion layer such as this can be used.

For example, it is also possible to use a method of ion implantation. Such a method shall therefore be described with reference to FIG. 17.

A layer 20 of a guiding material (GaInP for example) is made on a substrate 1. On this layer, a superlattice of quantum wells 21, constituted by barrier layers of GaInP and layers of GaAs quantum wells is made.

An implantation of germanium or silicon will create an interdiffusion of group III and V elements at the interfaces between the GaInP barrier layers and the layers of GaAs quantum wells. Consequently, in the interdiffusion zones, the quantum well layers change their chemical nature in locally becoming GaInAsP wells. In these wells, the gap width of a quantum well increases and the guided wavelength decreases. The zones that have been subjected to an implantation may therefore act as a guide associated with a laser.

Figure 17:
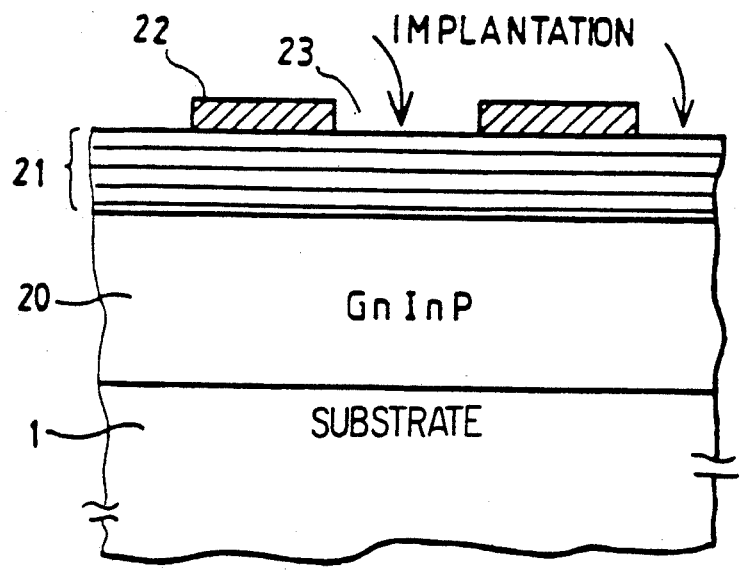
FIGS. 17 to 18 show an exemplary method, according to the invention, using implantation.

To make a device such as this, there is deposited, as shown in FIG. 17, a mask with masked zones 22 and unmasked zones.

The masked zones 22 correspond to the lasers to be made. The unmasked zones enable the making of the guides.

After implantation, the mask 22 is removed, and then the guides are defined in the zone or zones that have undergone the implantation.

These guides are, for example, etched and their position is such that they are located in continuity with the lasers.

Then, the entire unit is covered by a confinement layer 24 (made of p doped GaInP) and by a contact layer (made of p+ doped GaAs).

Figure 18:
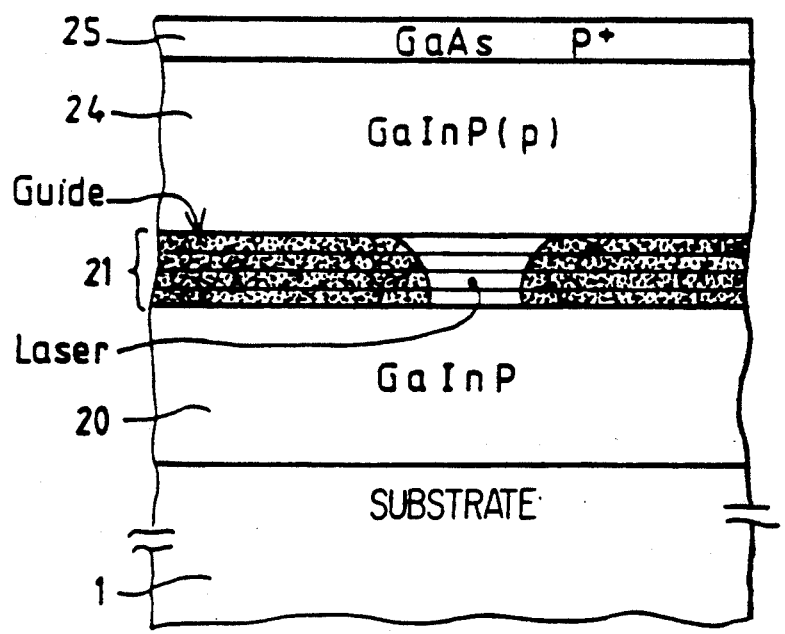

A structure such as the one shown in FIG. 18 is obtained.

This method has therefore enabled the making of a laser and its integrated guide.

According to one variant of the method of the invention it is possible, by combining a diffusion and an implantation, to make a photodetector, an optical guide and a laser on one and the same substrate.

Figure 19:
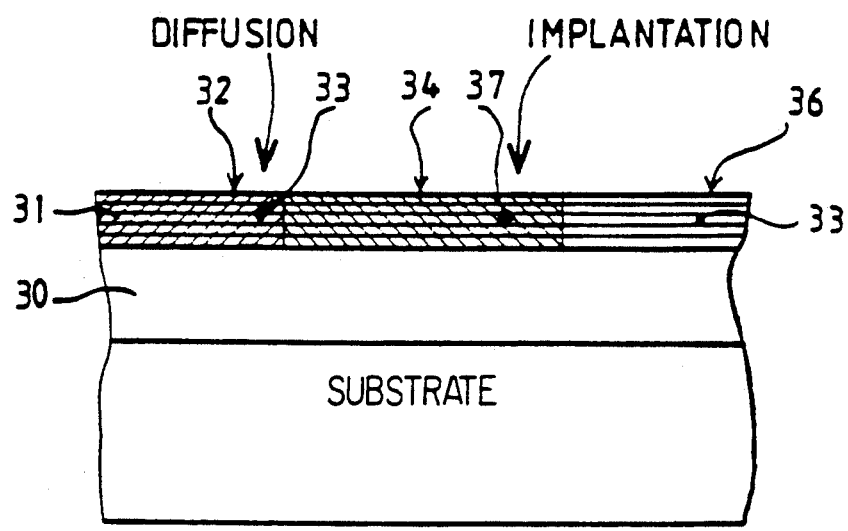
FIG. 19 shows a combination of different methods according to the invention.

As here above, a confinement layer 30, a superlattice 31 of quantum wells (GaInP/GaAs for example) are made (FIG. 19) on a substrate 1.

In the superlattice 31, a diffusion of a material (zinc for example) is made, enabling an interdiffusion of elements (indium) at the interfaces of the barriers and wells of the superlattice. This diffusion is done in at least one zone 32 and enables the making of a photodetector 33.

In another zone 34, an implantation (silicon or germanium for example) is made also enabling an interdiffusion of elements (indium, phosphorus) at the interfaces of the barriers and wells. In this zone 34, thus, an optical guide 37 is made.

A third zone 36 undergoes no interdiffusion and acts as a laser 33. The same is the case, for example, with the zone 36 opposite the zone 35 with respect to the laser 33.

It is clear that the foregoing description has been given purely by way of an example.

The examples of materials and the thicknesses of the layers have been given only to illustrate the description. The methods used (diffusion and implantation) too have been given purely by way of an example.

What is claimed is:

1. A method for the making of optoelectronic semiconductor devices, wherein said method comprises the making of at least one semiconductor quantum well, the barriers of which are made of GaInP and the material of the well of which is GaAs, followed by an interdiffusion of elements between barriers and quantum wells so that there is a migration of at least indium elements from this barrier towards the quantum well.

2. A method according to claim 1, wherein the interdiffusion is done by the diffusion of impurities or the implantation of elements.

3. A method according to claim 2, wherein the diffusion or the implantation is preceded by the making of a mask through which the diffusion or implantation is done.

4. A method according to claim 2, wherein the diffusion of impurities is done by means of zinc which prompts the migration of indium elements to the material of the well.

5. A method according to claim 2, wherein the implantation of impurities is done by means of silicon or germanium which prompts the migration of In and P elements to the material of the well.

6. A method according to claim 1, comprising the making of a stack of quantum wells (multiple quantum wells).

7. A method according to claim 1, wherein said method is preceded by the making of a first stack of layers acting as a Bragg reflector and wherein it is ended by the making of a second stack of layers also acting as a Bragg reflector.

8. A method according to claim 1, enabling the making of a laser by the diffusion of impurities.

9. A method according to claim 1, enabling the making of a laser by implantation.

10. A method according to claim 1, enabling the making of a laser by diffusion and of a guide on one and the same substrate.

11. A method according to claim 1, enabling the making of a guide by implantation and of a laser on one and the same substrate.

12. A method according to claim 1, enabling the making, on one and the same substrate, of a laser by diffusion, a photodetector by implantation and a guide in zones subjected neither to diffusion nor to implantation.

* * * * *